(12) United States Patent
Shieh et al.

(10) Patent No.: US 7,501,051 B2
(45) Date of Patent: Mar. 10, 2009

(54) ELECTROPOLISHING ELECTROLYTE AND METHOD FOR PLANARIZING A METAL LAYER USING THE SAME

(75) Inventors: Jia Min Shieh, Hsinchu (TW); Sue Hong Liu, Pingtung (TW); Bau Tong Dai, Baushan Township, Hsinchu County (TW)

(73) Assignee: BASF Aktiengesellschaft, Ludwigshafen (DE)

( * ) Notice: Subject to any disclaimer, the term of this patent is extended or adjusted under 35 U.S.C. 154(b) by 808 days.

(21) Appl. No.: 11/051,163

(22) Filed: Feb. 4, 2005

(65) Prior Publication Data

US 2006/0070888 A1  Apr. 6, 2006

(30) Foreign Application Priority Data

Oct. 6, 2004  (TW)  ................ 93130211 A

(51) Int. Cl.
*B23H 11/00* (2006.01)
(52) U.S. Cl. ........................ 205/677; 205/668; 205/669; 205/674; 205/675; 205/676; 205/678; 205/680; 438/691; 438/692; 438/697; 438/700
(58) Field of Classification Search ................ 205/668, 205/669, 674–678, 680; 438/690, 691, 692, 438/697, 700
See application file for complete search history.

(56) References Cited

U.S. PATENT DOCUMENTS

| 4,920,361 | A | * | 4/1990 | Arahara et al. ............ 346/140.1 |
| 5,066,370 | A | * | 11/1991 | Andreshak et al. .......... 205/651 |
| 6,491,808 | B2 | * | 12/2002 | Ichinose et al. ............. 205/646 |
| 2003/0178320 | A1 | * | 9/2003 | Liu et al. .................... 205/640 |

FOREIGN PATENT DOCUMENTS

| CA | 1354285 | 6/2002 |
| JP | 5163600 | 6/1993 |
| TW | 567545 | 12/2003 |
| WO | WO 97/39168 | 10/1997 |

* cited by examiner

*Primary Examiner*—Bruce F Bell
(74) *Attorney, Agent, or Firm*—Hoffmann & Baron, LLP

(57) ABSTRACT

The present electropolishing electrolyte comprises an acid solution and an alcohol additive having at least one hydroxy group, wherein the contact angle of the alcohol additive is smaller than the contact angle of the acid solution on a metal layer under electropolishing. The alcohol additive is selected methanol, ethanol and glycerol, and the acid solution comprises phosphoric acid. The volumetric ratio of glycerol to phosphoric acid is between 1:50 and 1:200, and is preferably 1:100. The volumetric ratio is between 1:100 and 1:150 for methanol to phosphoric acid, and between 1:100 and 1:150 for ethanol to phosphoric acid. In addition, the acid solution further comprises an organic acid selected from the group consisting of acetic acid and citric acid. The concentration is between 10000 and 12000 ppm for the acetic acid, and between 500 and 1000 ppm for citric acid.

14 Claims, 6 Drawing Sheets

ELECTROPOLISHING ELECTROLYTE AND METHOD FOR PLANARIZING A METAL LAYER USING THE SAME

This application claims priority to Taiwanese Patent Application No. 093130211 filed on Oct. 6, 2004.

BACKGROUND OF THE INVENTION (A) Field of the Invention

The present invention relates to an electropolishing electrolyte and method for planarizing a metal layer using the same, and more particularly, to an electropolishing electrolyte including an alcohol additive and method for planarizing a metal layer using the same.

(B) Description of the Related Art

In semiconductor manufacturing technology, an ideal planar surface without altitudinal difference is necessary for high-density photolithography process to avoid exposure scattering so as to realize the precise pattern transfer of integrated circuits. Chemical-mechanical polishing technology is a widely used surface planarization technology in current semiconductor fabrication process. However, the chemical-mechanical polishing technology faces some important theories in actual applications, such as pattern effect, removing selection ratio, dishing, scratching, and insulating abrasion and cleaning after polishing. In addition, to meet the low stress requirement for 12" wafer and low dielectric constant materials, the chemical-mechanical polishing technology will confront with more challenges.

Compared to the chemical-mechanical polishing technology, the electropolishing technology has become an alternative solution of the chemical-mechanical polishing technology because of several advantages such as reducing scratching, reducing particles absorption and reducing discard solution, high polishing rate and no pressure applying on the wafer. In the copper conductor process at the back end of the semiconductor fabrication, the electroplating technology is generally used to form a copper conductive layer. However, the copper conductive layer will produce a step height due to trenches on the surface of the wafer, which will further influence the planarization efficiency of a subsequent electropolishing process.

SUMMARY OF THE INVENTION

The objective of the present invention is to provide an electropolishing electrolyte including an alcohol additive and method for planarizing a metal layer using the same.

In order to achieve the above-mentioned objective and avoid the problems of the prior art, the present invention provides an electropolishing electrolyte including an alcohol additive and method for planarizing a metal layer using the same. The present electropolishing electrolyte comprises an acid solution and an alcohol additive having at least one hydroxy group, wherein the contact angle of the alcohol additive is smaller than the contact angle of the acid solution on a metal layer under electropolishing. The alcohol additive is selected from methanol, ethanol and glycerol, and the acid solution comprises phosphoric acid. The volumetric ratio of glycerol to phosphoric acid is between 1:50 and 1:200, preferably 1:100. The volumetric ratio is between 1:100 and 1:150 for methanol to phosphoric acid, and between 1:100 and 1:150 for ethanol to phosphoric acid. In addition, the acid solution further comprises an organic acid selected from the group consisting of acetic acid and citric acid. The concentration is between 10000 and 12000 ppm for the acetic acid, and between 500 and 1000 ppm for citric acid.

The present invention discloses a method for planarizing a metal layer having at least one concave and one convex. The method is characterized by using an alcohol additive to form an inhibition layer on the metal layer to reduce the polishing rate on the surface of the metal layer and using an acid solution to polish the metal layer, wherein the acid solution forms a concentration gradient between the concave and the convex so that the polishing rate is faster on the convex than the polishing rate on the concave.

BRIEF DESCRIPTION OF THE DRAWINGS

Other objectives and advantages of the present invention will become apparent upon reading the following description and upon reference to the accompanying drawings in which.

DETAILED DESCRIPTION OF THE INVENTION

Figure 1:
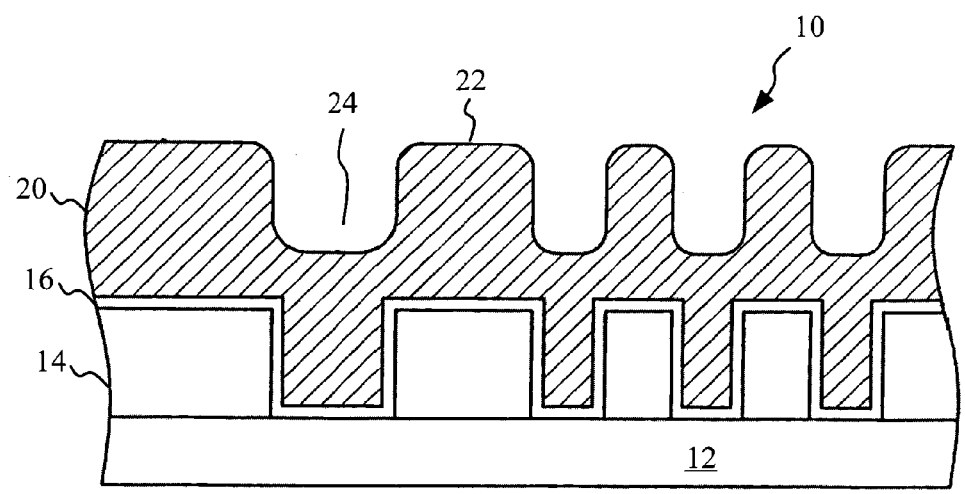
FIG. 1 is a cross-sectional view of a wafer.

FIG. 1 is a cross-sectional view of a wafer 10. The wafer 10 comprises a substrate 12, a dielectric layer 14, a barrier layer 16 and a metal layer 20. The metal layer 20 can be a copper layer having a convex 22 and a concave 24. The present invention planarizes the metal layer 20 by an electropolishing electrolyte including an alcohol additive and an acid solution. Preferably, the alcohol additive is selected from glycerol, methanol or ethanol, while the acid solution may comprise phosphoric acid and an organic acid. The method for preparing the electropolishing electrolyte first mixes the phosphoric acid and the alcohol additive by a predetermined volumetric ratio and the organic acid is then added. The organic acid can be acetic acid or citric acid, and the concentration is between 10000 and 12000 ppm for acetic acid, and between 500 and 1000 ppm for citric acid.

If the acid solution is the phosphoric acid and the alcohol additive is glycerol, the volumetric ratio of glycerol and phosphoric acid is preferable between 1:50 to 1:200, i.e. the concentration of the glycerol at 25° C. is preferably between $2.73 \times 10^{-1}$ M and $6.85 \times 10^{-2}$ M. Preferably, the volumetric ratio of the glycerol to the phosphoric acid is 1:100, i.e. the concentration of the glycerol is $1.36 \times 10^{-1}$ M. In addition, if the alcohol additive is methanol or ethanol, the volumetric ratio of the alcohol to the phosphoric acid is between 1:100 and 1:150, i.e. the concentration of the methanol at 25° C. is between $2.50 \times 10^{-1}$ M and $1.67 \times 10^{-1}$ M, and the concentration of the ethanol at 25° C. is between $1.76 \times 10^{-1}$ M and $1.17 \times 10^{-1}$ M. Preferably, the volumetric ratio of the methanol or the ethanol to the phosphoric acid is 1:100.

Figure 2:
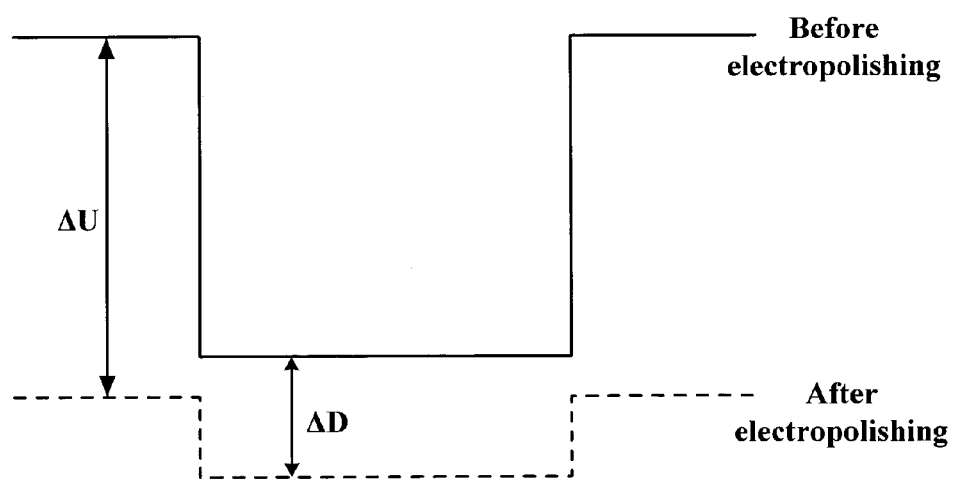
FIG. 2 is a schematic diagram showing the measurement of the planarization efficiency (PE) for an electropolishing electrolyte.

FIG. 2 is a schematic diagram showing the measurement of the planarization efficiency (PE) for an electropolishing electrolyte. The planarization efficiency is calculated according to the following formula:

$$PE = [1 - (\Delta D / \Delta U)] \times 100\%$$

Where $\Delta D$ is the difference of the step height of a concave 24 on the surface of the metal layer 20 before and after the electropolishing process, and $\Delta U$ is the difference of the step height of the convex 22 on the surface of the metal layer 20 before and after electropolishing process.

Figure 3:
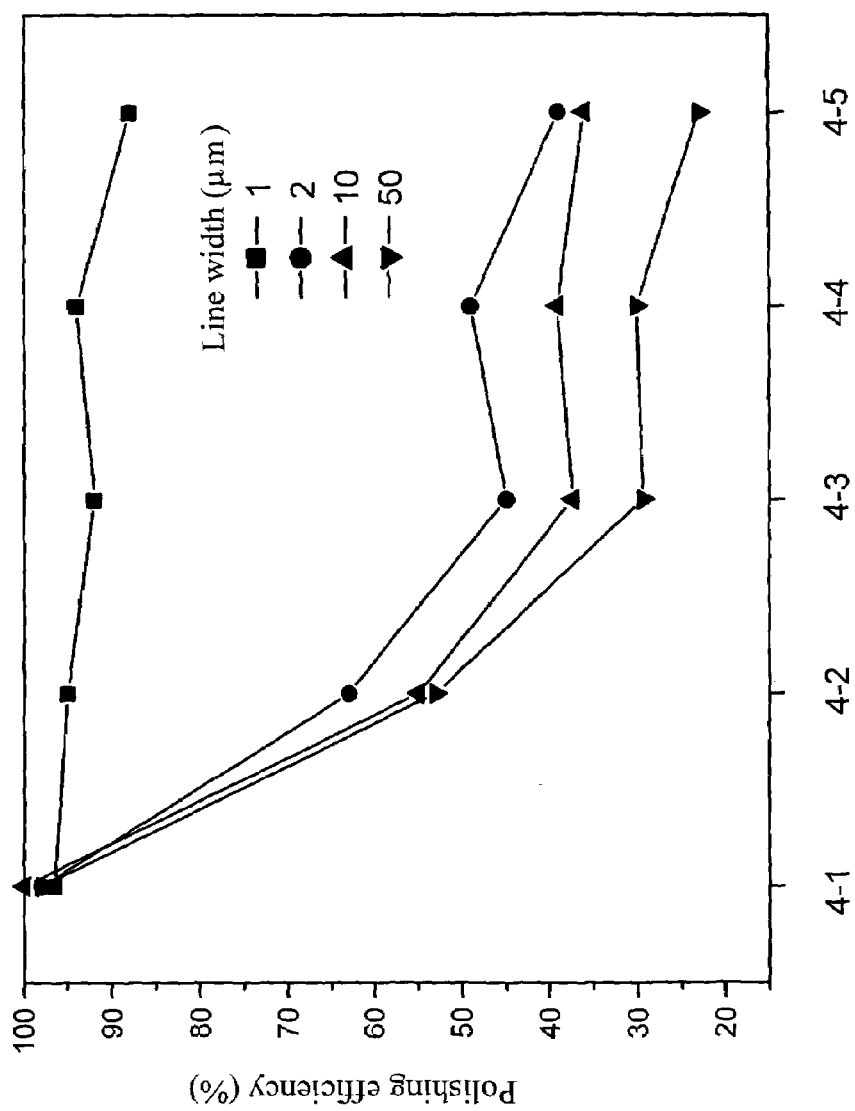
FIG. 3 shows the planarization efficiency of the electropolishing electrolyte for different line width according to the present invention.

FIG. 3 shows the planarization efficiency of the electropolishing electrolyte for different line width according to the present invention, wherein the applied voltage in the electropolishing process is 1.75 (Volt), and the electropolishing time is 180 seconds. The lateral axis 4-1, 4-2, 4-3, 4-4 and 4-5 represent 5 different electropolishing electrolyte recipes, and phosphoric acid, glycerol and methanol are expressed by volumetric ratio, as shown in the table below.

| 4-1 | Phosphoric acid:Glycerol 100:1 | Acetic acid 10000 ppm |
|---|---|---|
| 4-2 | Phosphoric acid:Glycerol 100:1 | Citric acid 1000 ppm |
| 4-3 | Phosphoric acid:methanol 100:1 | No organic acid |
| 4-4 | Phosphoric acid:glycerol 100:1 | No organic acid |
| 4-5 | Pure phosphoric acid | No organic acid |

As shown in FIG. 3, the planarization efficiency of the electropolishing electrolyte 4-5 without an alcohol additive and an organic acid is the worst. Comparing the planarization ability of the alcohol additive only, the planarization efficiency of the electropolishing electrolyte 4-4 using the glycerol as the alcohol additive is superior to that of the electropolishing electrolyte 4-3 using the methanol as the alcohol additive. In addition, the planarization efficiency of the electropolishing electrolyte 4-1 and 4-2 using phosphoric acid is superior to that of the electropolishing electrolyte 4-3, 4-4 and 4-5 without the addition of the organic acid.

In other words, the planarization efficiency of the electropolishing electrolyte with two additives (organic acid and alcohol additive) is better than that with only adding organic acid. In addition, comparing the planarization efficiency of the electropolishing electrolyte 4-1 with the acetic acid mixed with a proper amount of glycerol is superior to that of the electropolishing electrolyte 4-2 with the citric acid mixed with the glycerol, and the planarization ability of the electropolishing electrolyte using the acetic acid is greater than that using the citric acid. Consequently, one can find an electropolishing electrolyte with an appropriate recipe of dual additives and have optimal planarization efficiency within a line width range between 1 and 50 μm.

Figure 4:
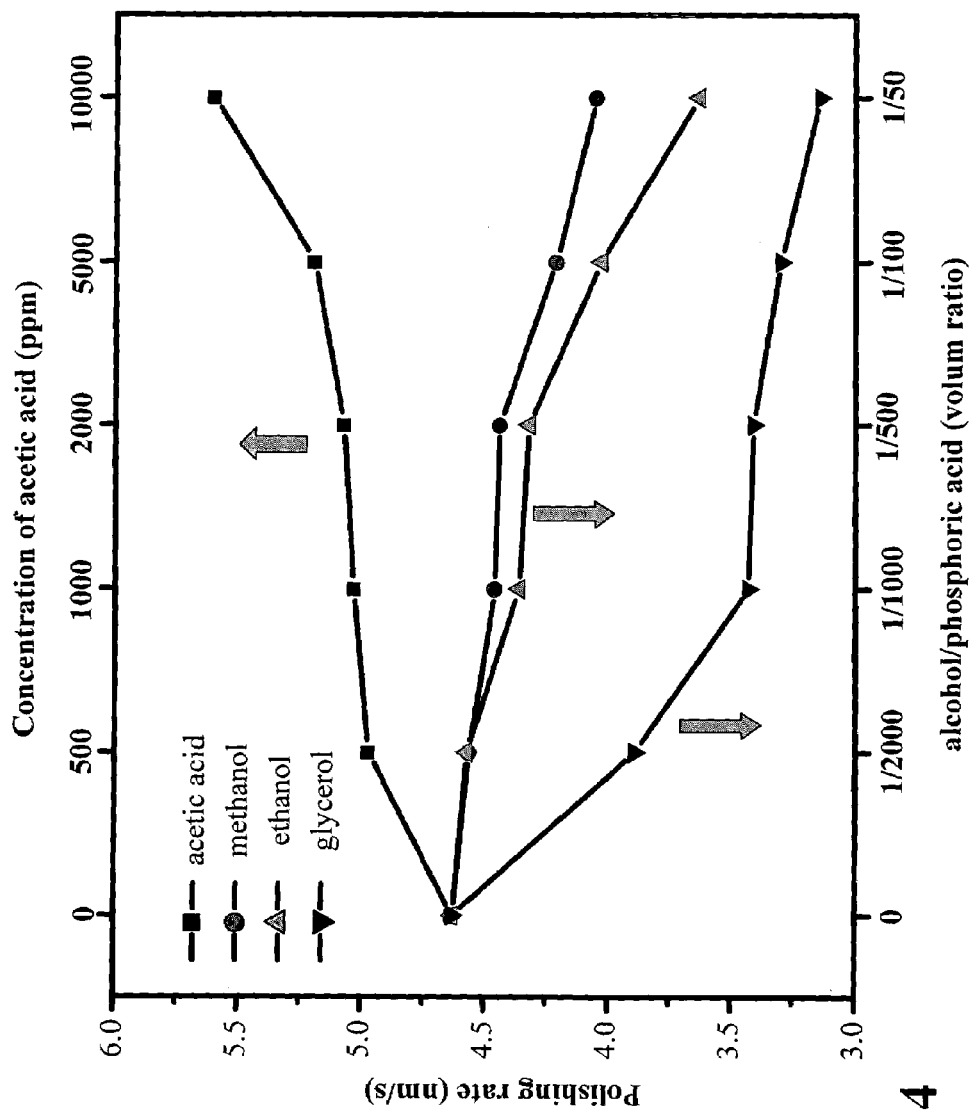
FIG. 4 shows the polishing rate of the electropolishing electrolyte according to the present invention.

FIG. 4 shows the polishing rate of the electropolishing electrolyte according to the present invention. When the concentration of the organic acid in the phosphoric acid is smaller than a certain value (12000 ppm), the polishing rate will increase with the increment of the organic acid. Correspondingly, when the volumetric ratio of the alcohol additive to the phosphoric acid is smaller than 1/100 such as the volumetric ratio 1/500 and 1/1000), the polishing rate is almost the same as that of the volumetric ratio 1/100. In other words, when the solubility of the organic acid in the phosphoric acid does not reach to the limit value (12000 ppm), the corresponding copper polishing rate is sensitive, while the polishing rate is insensitive when the volumetric ratio of the alcohol additive to phosphoric acid is below 1/100, and the polishing rate will not increase until the volumetric ratio is increased up to 1/2000. According to the present invention, the applicable concentration of the alcohol additive is selected right in the insensitive range in which the corresponding polishing rate is insensitive, as shown in FIG. 4.

Glycerol possesses the minimal contact angle (about 19.35°) on a copper surface in the alcohol additives such as glycerol, methanol and ethanol, while the contact angle of the pure phosphoric acid on the copper surface is 89°. Therefore, the reason why the alcohol additive can improve planarization efficiency of the electropolishing electrolyte is possibly due to the different wettability on the copper surface, which will accordingly influence its ability to inhibit the polishing rate to copper. As shown in FIG. 4, the glycerol has the most powerful inhibitive ability to the copper electropolishing. The three alcohol additives are added into a phosphoric acid to prepare three electropolishing electrolytes, and the planarization efficiency of the electrolyte containing glycerol is greater than that of the electrolytes containing the methanol and the ethanol (the planarization efficiency of the methanol is close to that of the ethanol). The planarization efficiency is thereby considered to be associated with the contact angle of the added alcohol additive on the copper surface.

Figure 5:
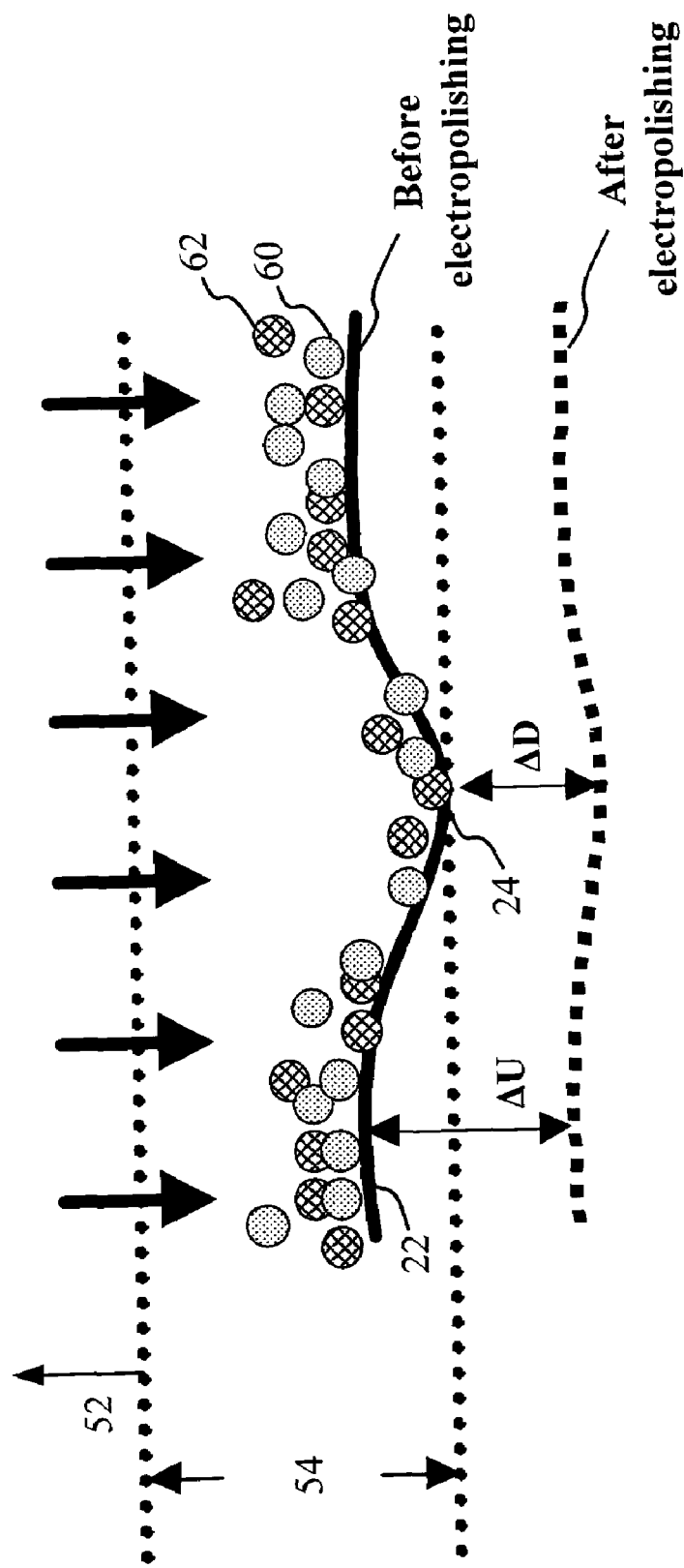
FIG. 5 is a schematic diagram showing the operation of the electropolishing electrolyte according to the present invention.

FIG. 5 is a schematic diagram showing the operation of the electropolishing electrolyte according to the present invention. As shown in FIG. 5, the electropolishing electrolyte on the metal layer 20 (referring the FIG. 1) can be divided into two regions; a bulk region 52 and a diffusion region 54. Each species of the electropolishing electrolyte is distributed uniformly in the bulk region 52, while the species presents a concentration gradient in the diffusion region 54 due to the electropolishing reaction on the surface of the metal layer 20. In other words, when the electropolishing process is performed using an electrolytes with both organic acid 62 and alcohol additive 60 in the phosphoric acid, the alcohol additive 60 and the organic acid 62 will present a concentration gradient distribution between the convex 22 and the concave 24 on the copper metal layer 20 during the electropolishing process, i.e. the concentration of the organic acid 62 in the concave 24 is smaller than that in the convex 22.

Since the concentration of the alcohol additive 60 and the organic acid 62 presents a gradient distribution on rough surface of the copper metal layer 20, and the concentration of these additives in convex 22 is higher than that in concave 24. If the additive diffused into the concave 24 is the alcohol additive 60, the copper metal layer in the concave 24 will be prevented from being etched. If the additive is the organic acid 62, the electropolishing rate in the concave 24 will be much smaller than that in the convex 22 since the amount of the organic acid 62 in the concave 24 is smaller than that in the convex 22. The present invention adds a certain amount of alcohol additive and the organic acid into the phosphoric acid electrolyte to perform the electropolishing process. Consequently, the concave 24 of the copper metal layer 20 is removed at a slower rate than the convex 22, which can accordingly improve planarization efficiency of the electropolishing electrolyte.

Several electropolishing processes are performed on a copper surface without patterns using different electrolytes containing different amount of organic acid and alcohol additive. As mentioned in the above description, the electropolishing rate will increase as the addition of the organic acid if the concentration of organic acid 62 in phosphoric acid is smaller than a certain value (12000 ppm). The electropolishing rate of an electrolyte with a volumetric ratio of alcohol additive 60 to the phosphoric acid below 1/100, such as 1/500 and 1/1000, is almost the same as that of another electrolyte containing the alcohol additive 60 with a volumetric ratio 1/100. In other words, copper electropolishing rate is sensitive when the solubility of the organic acid 62 in the phosphoric acid does not reach a limit value, the electropolishing rate is insensitive when the volumetric ratio of alcohol additive 60 to the phosphoric acid is under 1/100, and the electropolishing rate will increase if the volumetric ratio is increased up to 1/2000.

During the electropolishing process, the organic acid 62 increases the electropolishing rate and the alcohol additive 60 inhibits electropolishing rate of the convex 22 and the concave 24 in diffusion region 54 simultaneously. Inhibitive effect (decreasing the electropolishing rate) of the alcohol additive 60 in the convex 22 is almost the same as that in the concave 24. The organic acid 62 is sensitive to the concentration, i.e., the electropolishing rate in the convex 22 is faster since there is a higher concentration of the organic acid 62, and the electropolishing rate in the concave 24 is slower since there is a lower concentration of the organic acid 62. Correspondingly, alcohol additive has similar inhibitive effect in the convex 22 and concave 24.

In short, the present electrolytes can increase the electropolishing rate difference of a copper metal layer 20 with a rough surface, and the electropolishing rate in the convex 22 is higher than that in the concave 24 on the copper layer 20 to increase the planarization efficiency of the copper electropolishing process. In addition, the wettability of the glycerol is greater than that of other hydroxyl-containing organic additive, a certain amount of glycerol can be added into the phosphoric acid will result in a different diffusion ability for electropolishing species in the concave 24 and in the convex 22, and generate a higher planarization efficiency that the other hydroxyl-containing organic additive.

Figure 6:
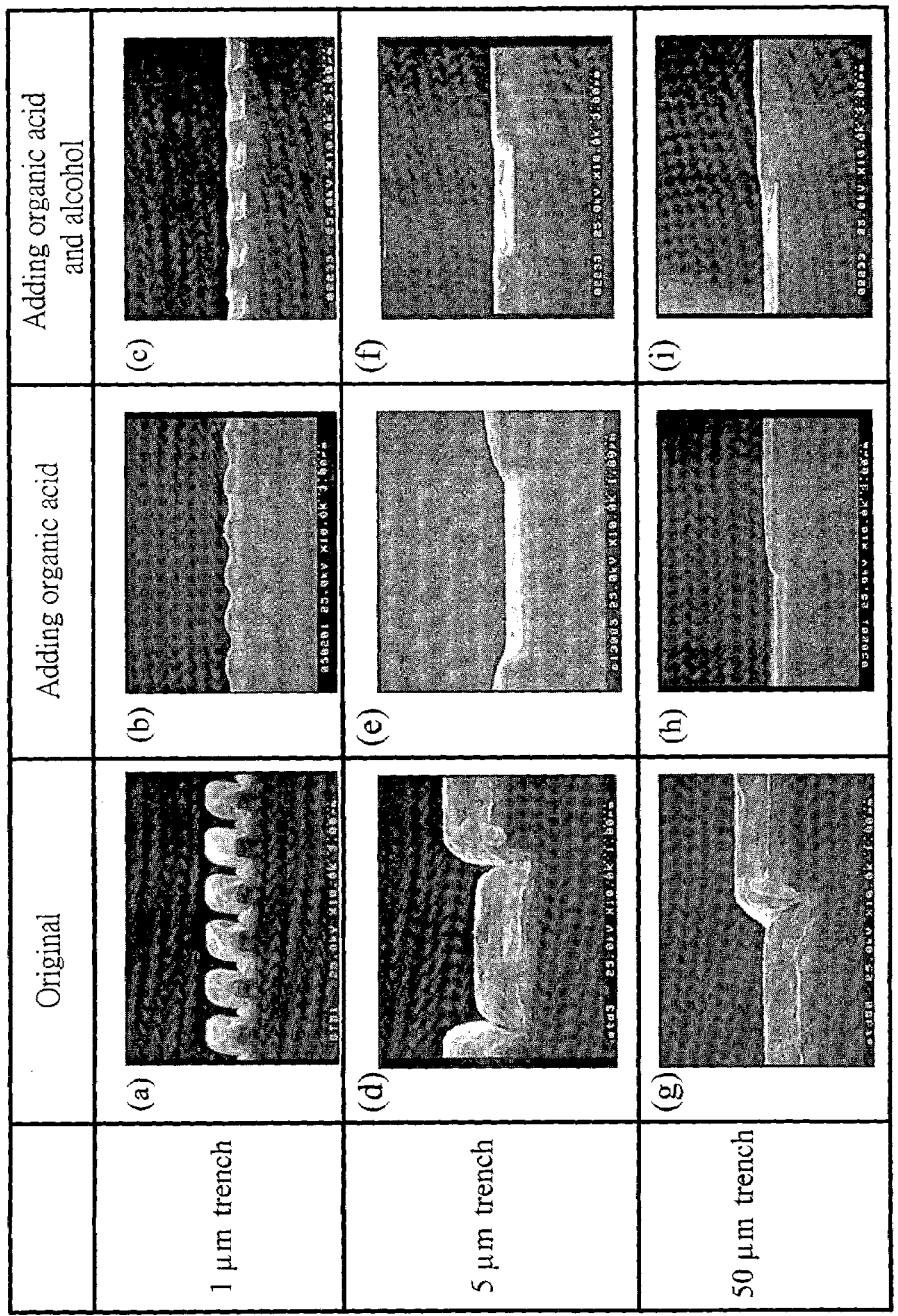
FIG. 6 shows several electronic scanning images of trenches with width of 1, 5 and 50 μm.

FIG. 6 shows several electronic scanning images of trenches with width of 1, 5 and 50 μm before and after planarization using the electropolishing electrolyte4-1. The surface of the trench has been deposited with a copper layer before the planarization process, as shown in FIGS. 6(a), 6(d) and 6(g). The planarization process is performed for 180 seconds under a voltage of 1.75 (Volt) using the electropolishing electrolyte 4-1. The energy dispersive spectrometer (EDS) is used to perform an element analysis inside and outside of the trench, the element inside the trench is primarily copper, while elements outside the trench are primarily tantalum (Ta) consisting of the diffusion layer. Consequently, the present electropolishing electrolyte can actually keep copper inside the trench (i.e., inside the concave), and remove copper outside the trench (i.e. inside the convex) to planarize the copper layer. Three different line widths are completely planarized after an electropolishing process using the electrolyte 4-1, as shown in FIGS. 6 (c), 6(f) and 6(i). FIGS. 6 (b), 6(e) and 6(h) are images after an electropolishing process using an electrolyte adding an organic acid only into phosphoric acid, wherein the planarization efficiency does not achieve the highest although there is a certain improvement, and the planarization efficiency is different from that of the electrolyte containing both the organic acid and the alcohol additive.

Figure 7B:
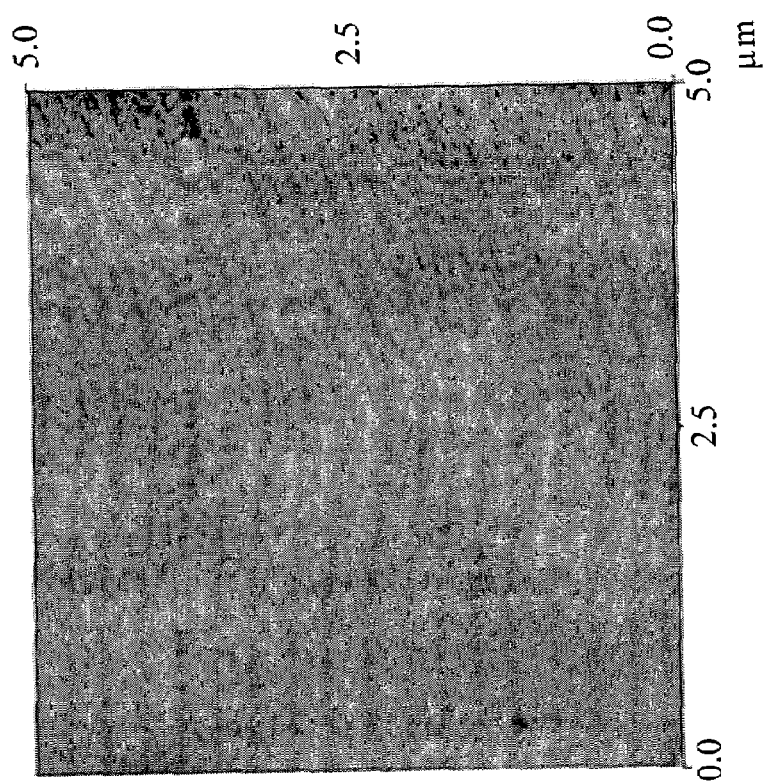
FIG. 7($a$) and FIG. 7($b$) are atomic force microscope (AFM) images after polishing on copper surface.
Figure 7A:
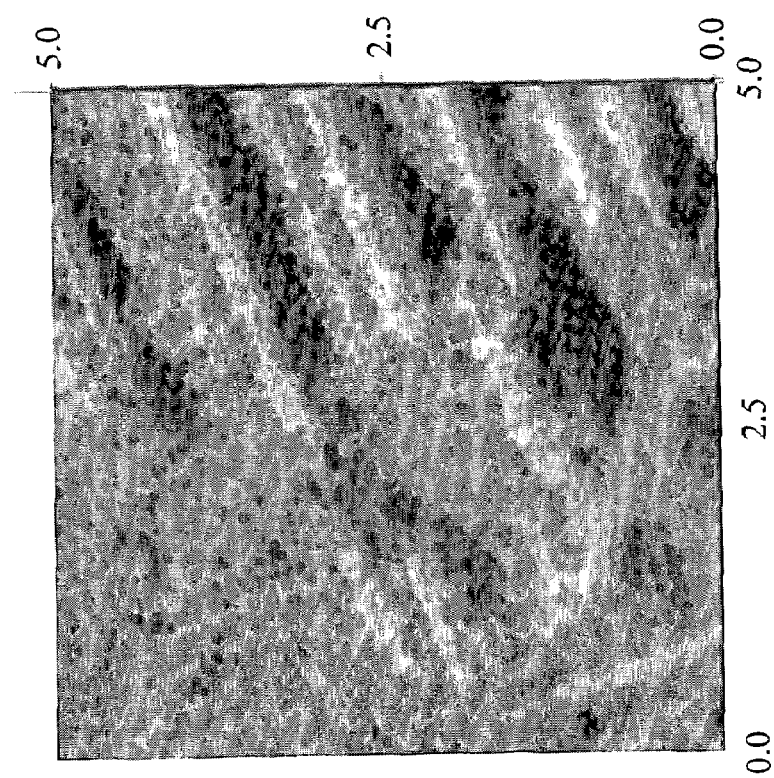

FIG. 7(a) and FIG. 7(b) are atomic force microscope (AFM) images after polishing on copper surface, wherein the electropolishing electrolyte used in FIG. 7(a) does not include alcohol additive, while the electropolishing electrolyte used in FIG. 7(b) has the alcohol additive. During the electropolishing process, water molecules in the electropolishing electrolyte will be decomposed to produce Oxygen, which will form many pits on the copper surface, i.e. black spots as shown in FIG. 7 (a). Copper (Cu) will be oxidized into copper ion ($Cu^{2+}$) by the applied voltage during the electropolishing process, and the copper ion exists in the electropolishing electrolyte in forms of copper oxide (CuO) or cupric hydroxide ($Cu(OH)_2$). Since the alcohol additive compound can reduce reactants and remove copper oxide on the copper surface to form a clear surface, adding the alcohol additive into the electropolishing electrolyte can inhibit the formation of the black spots, as shown in FIG. 7 (b).

The above-described embodiments of the present invention are intended to be illustrative only. Numerous alternative embodiments may, be devised by those skilled in the art without departing from the scope of the following claims.

What is claimed is:

1. An electropolishing electrolyte comprising an acid solution and an alcohol additive, wherein the contact angle of the alcohol additive on a metal layer under electropolishing is smaller than the contact angle of the acid solution, wherein the acid solution comprises phosphoric acid and an organic acid selected from the group consisting of acetic acid and citric acid; the alcohol additive is selected from the group consisting of methanol, ethanol and glycerol; and the volumetric ratio of the alcohol additive to the acid solution is between 1:50 and 1:200.

2. The electropolishing electrolyte of claim 1, wherein the volumetric ratio of glycerol to phosphoric acid is between 1:50 and 1:200.

3. The electropolishing electrolyte of claim 1, wherein the volumetric ratio of glycerol to phosphoric acid is 1:100.

4. The electropolishing electrolyte of claim 1, wherein the volumetric ratio of methanol to phosphoric acid is between 1:100 and 1:150.

5. The electropolishing electrolyte of claim 1, wherein the volumetric ratio of ethanol to phosphoric acid is between 1:100 and 1:150.

6. The electropolishing electrolyte of claim 1, wherein the concentration of the acetic acid is between 10000 and 12000 ppm.

7. The electropolishing electrolyte of claim 1, wherein the concentration of the citric acid is between 500 and 1000 ppm.

8. A method for planarizing a metal layer, the metal layer having at least one concave and one convex, characterized in using an alcohol additive to form an inhibition layer on the metal layer to reduce the polishing rate on the surface of the metal layer and using an acid solution to polish the metal layer, wherein the acid solution forms a concentration gradient between the concave and the convex so that the polishing rate is faster on the convex than the polishing rate on the concave, wherein the acid solution comprises phosphoric acid and an organic acid selected from the group consisting of acetic acid and citric acid, the alcohol additive is selected from the group consisting of methanol, ethanol and glycerol, and the volumetric ratio of the alcohol additive to the acid solution is between 1:50 and 1:200.

9. The method for planarizing a metal layer of claim 8, wherein the volumetric ratio of glycerol to phosphoric acid is between 1:50 and 1:200.

10. The method for planarizing a metal layer of claim 9, wherein the volumetric ratio of glycerol to phosphoric acid is 1:100.

11. The method for planarizing a metal layer of claim 8, wherein the volumetric ratio of methanol to phosphoric acid is between 1:100 and 1:150.

12. The method for planarizing a metal layer of claim 8, wherein the volumetric ratio of ethanol to phosphoric acid is between 1:100 and 1:150.

13. The method for planarizing a metal layer of claim 8, wherein the concentration of the acetic acid is between 10000 and 12000 ppm.

14. The method for planarizing a metal layer of claim 8, wherein the concentration of the citric acid is between 500 and 1000 ppm.

* * * * *